United States Patent [19]

Nakano

[11] 4,396,845
[45] Aug. 2, 1983

[54] ADDRESS BUFFER CIRCUIT

[75] Inventor: Tomio Nakano, Kawasaki, Japan

[73] Assignee: Fujitsu Limited, Kawasaki, Japan

[21] Appl. No.: 243,862

[22] Filed: Mar. 16, 1981

[30] Foreign Application Priority Data

Mar. 18, 1980 [JP] Japan .................................. 55-34382

[51] Int. Cl.³ .......................... H03K 3/356; G11C 7/00
[52] U.S. Cl. .................................... 307/475; 307/578;
307/581; 365/203; 365/205; 365/230
[58] Field of Search ............... 307/450, 453, 475, 481,
307/482, 242, 238.6, 238.8, 574, 578, 581, 583,
272 A, 463, DIG. 1, DIG. 3, DIG. 4, 264;
365/203, 230, 233, 205

[56] References Cited

U.S. PATENT DOCUMENTS

| | | | |
|---|---|---|---|
| 4,110,841 | 8/1978 | Schroeder | 365/205 |
| 4,149,099 | 4/1979 | Nagami | 307/279 |
| 4,247,917 | 1/1981 | Tsang et al. | 307/578 X |
| 4,301,381 | 11/1981 | Clemen et al. | 307/264 X |

OTHER PUBLICATIONS

Blaser et al., "Level Converting Circuit", *IBM Tech. Disc. Bull.;* vol. 18, No. 11, 4-1976, p. 3722.
Leach et al., "A 1K×8-Bit 5V-Only Static RAM", 1978 IEEE International Solid-State Circuits Conference Digest of Technical Papers, Session IX, p. 104.

*Primary Examiner*—Stanley D. Miller
*Assistant Examiner*—David R. Hudspeth
*Attorney, Agent, or Firm*—Staas & Halsey

[57] ABSTRACT

An address buffer circuit for comverting an address signal ($A_i$) of a TTL level into an address signal (A) of a MOS level an its inverted signal ($\bar{A}$) comprising: a pre-amplifier (P-AMP) for receiving the address signal having a TTL level; a main amplifier (M-AMP) comprising a flip-flop ($FF_3$), a circuit for defining the operation of the flip-flop ($FF_3$); and an output circuit (OUT) comprised of another flip-flop ($FF_4$) for producing the address signals of a MOS level. In the pre-amplifier, a depletion type transistor ($Q_{34}$) is used as a reference constant current source, which is independent of a power supply voltage ($V_{DD}$), for the two values of the address signal of a TTL level.

8 Claims, 7 Drawing Figures

ADDRESS BUFFER CIRCUIT

BACKGROUND OF THE INVENTION

The present invention relates generally to an address buffer circuit used in a high-speed MOS (Metal Oxide Semiconductor) dynamic RAM (Random Access Memory) device.

In general, address signals of a TTL (Transistor Transistor Logic) level are supplied by an external circuit to a MOS dynamic RAM device. In this case, the low and high potentials of a TTL level are, for example, 0.8 volts and 2.0 through 2.4 volts, respectively. On the other hand, within the MOS dynamic RAM device, address signals of a MOS level whose low and high potentials are, for example, 0 volts and 5 volts, respectively, are used for accessing one memory cell among a memory cell matrix. Therefore, it is necessary to convert address signals of a TTL level into address signals of a MOS level. For carrying out such conversion, the device incorporates address buffer circuits therein.

One conventional address buffer circuit for converting an address signal of a TTL level into an address signal of a MOS level and its inverted signal comprises an input circuit for receiving the address signal of a TTL level, a pre-amplifier, a main amplifier and an output circuit for producing the address signal of a MOS level and its inverted signal. In order to operate this address buffer circuit, various kinds of clock signals are necessary.

However, in the above-mentioned conventional address buffer circuit, the circuit is of a relatively large scale. In addition, the operation speed is low, since the input circuit comprises a CR time-constant circuit. Further, the operation of the circuit is unstable, since a reference voltage which is dependent upon a power supply voltage is necessary and in addition, the main amplifier may be operated before the pre-amplifier comes into a predetermined state. Further, the malfunction of the output circuit may be invited by a dynamic operation.

SUMMARY OF THE INVENTION

It is a principal object of the present invention to provide an address buffer circuit with a small size.

It is another object of the present to provide an address buffer circuit with high-speed and stable operation.

According to the present invention, there is provided an address buffer circuit for converting an address signal of a TTL level into an address signal of a MOS level and its inverted signal, comprising: first and second power supplies; a pre-amplifier, connected to the second power supply, for receiving the address signal of a TTL level; a main amplifier connected to outputs of the pre-amplifier and comprising a first flip-flop having a first terminal connected to the first power supply and a second terminal; a circuit, connected beween the first and second power supplies, for defining the potential of the second terminal of the first flip-flop; and an output circuit connected to outputs of the main amplifier and comprising a second flip-flop for producing the address signal of a MOS level and its inverted signal. The pre-amplifier comprises: a first transistor of an enhancement type having a drain connected to a first input of the main amplifier and a gate for receiving a first clock signal; a second transistor of an enhancement type having a drain connected to a source of the fist transistor, having a source connected to the second power supply and a gate for receiving the address signal of a TTL level; having a third transistor of an enhancement type having a drain connected to a second input of the main amplifier and having a gate for receiving the first clock signal; and a fourth transistor of a depletion type having a drain connected to a source of the third transistor and having a gate connected to a source of the fourth transistor and to the second power supply.

The present invention will be more clearly understood from the following description contrasting the present invention with the conventional circuit and with reference to the accompanying drawings.

DESCRIPTION OF THE PREFERRED EMBODIMENT

Figure 1:
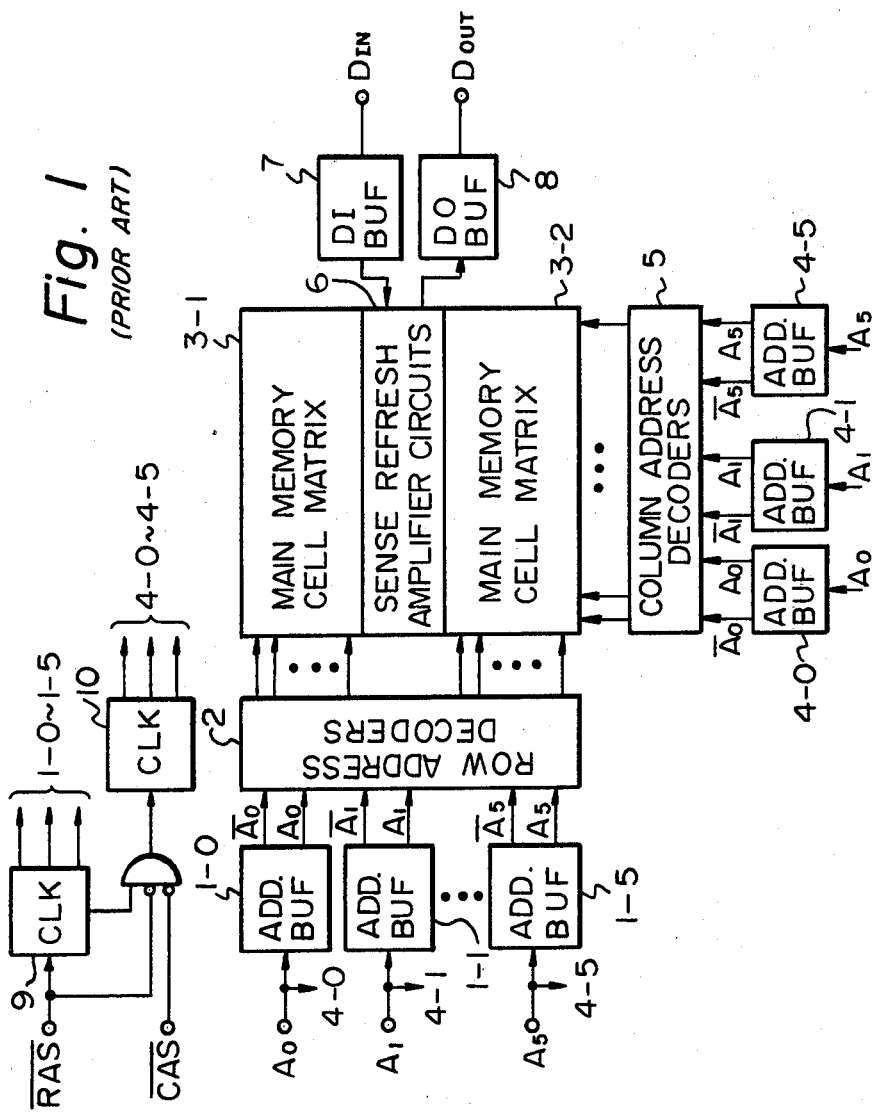
FIG. 1 is a block diagram illustrating a conventional MOS dynamic RAM device.

Referring to FIG. 1, which illustrates a conventional $4096(=2^{12})$ bit MOS dynamic RAM device, the device comprises row address buffer circuits 1-0, 1-1, ..., 1-5 for converting address signals $A_0, A_1, ..., A_5$ of a TTL level into address signals $A_0, A_1, ..., A_5$ of a MOS level and their inverted signals $\overline{A}_0, \overline{A}_1, ..., \overline{A}_5$, and row address decoders 2 for decoding the address signals $A_0, \overline{A}_0, A_1, \overline{A}_1 ..., A_5, \overline{A}_5$ (MOS level) so as to select one row from main memory cell matrixes 3-1 and 3-2. In addition, the device comprises column addrress buffer circuits 4-0, 4-1, ..., 4-5 for converting the address signals $A_0, A_1, ..., A_5$ (TTL level) into address signals $A_0, A_1, ..., A_5$ (MOS level) and their inverted signals $A_0, A_1, ..., A_5$ (MOS level) and column address decoders 5 for decoding the address signals $A_0, \overline{A}_0, A_1, \overline{A}_1, ..., A_5, \overline{A}_5$ so as to select one column from the main memory cell matrixes 3-1 and 3-2. In this case, each of the main memory cell matrixes 3-1 and 3-2 comprises 2048 memory cells; however, the matrixes 3-1 and 3-2 operate as one matrix. In addition, sense and refresh amplifier circuits 6 for sensing and refreshing the memory cells are provided between the two matrixes 3-1 and 3-2. Further, a data input buffer 7 having a terminal $D_{IN}$ and a data output buffer 8 having a terminal $D_{OUT}$ are connected to the sense and refresh amplifier circuits 6.

In the device of FIG. 1, such address signals (TTL level) are twice supplied to the device for one access thereto. Among them, a first group of the signals are used for selecting one row of the main memory cell matrixes 3-1 and 3-2, while a second group of the signals are used for selecting one column of the main memory cell matrixes 3-1 and 3-2. Such a time-divisional control of the address signals (TTL level) is effected by two clock generators 9 and 10. The clock generator 9 receives an inverted signal $\overline{RAS}$ of a row address strobe signal RAS and, in turn, generates internal clock signals for driving the row address buffer circuits 1-0, 1-1, ..., 1-5, while the clock generator 10 receives the signal $\overline{RAS}$, an inverted signal $\overline{CAS}$ of a column address strobe signal CAS and one internal clock signal from the clock generator 9 and, in turn, it generates internal clock signals for driving the column address buffer circuits 4-0, 4-1, ..., 4-5. The present inventin relates to the improvement of the row address buffer circuits 1-0, 1-1, ..., 1-5 and the column address buffer circuits 4-0, 4-1, ..., 4-5.

Figure 2:
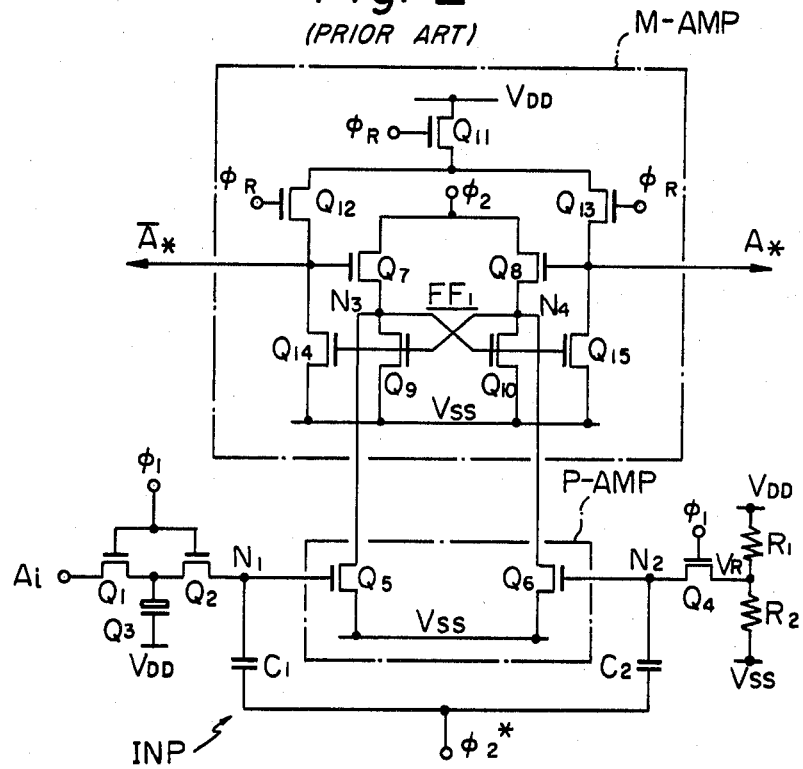
FIG. 2 is a circuit diagram illustrating a conventional address buffer circuit.
Figure 2:
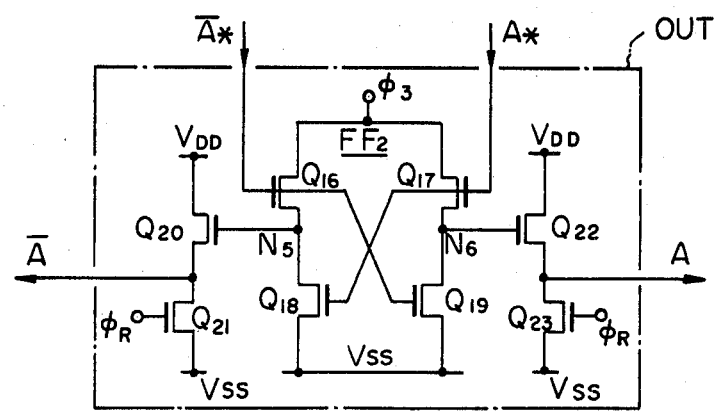

FIG. 2 is a circuit diagram illustrating a conventional address buffer circuit. This circuit converts an address signal $A_i$ of a TTL level into an address signal A of a MOS level and its inverted signal $\overline{A}$. In FIG. 2, $V_{SS}$ and $V_{DD}$ are power supplies of 0 and 5 volts, respectively, and, $\phi_1$, $\phi_2$, $\phi_2^*$, $\phi_R$ and $\phi_3$ are internal clock signals for driving the circuit of FIG. 2. These internal clock signals are generated from, for example, the clock generator 9 in FIG. 1. The circuit of FIG. 2 comprises an input circuit INP for receiving an address signal $A_i$ of a TTL level, a pre-amplifier P-AMP connected to the input circuit INP, a main amplifier M-AMP connected to the pre-amplifier P-AMP and an output circuit OUT connected to the main amplifier M-AMP.

In more detail, the input circuit INP comprises three transistors $Q_1$, $Q_2$ and $Q_4$ which serve as transfer gates, a MOS capacitor $Q_3$ for eliminating the bad effect caused by an undershoot of the address signal $A_i$, two capacitors $C_1$ and $C_2$ for raising the potentials at nodes $N_1$ and $N_2$, respectively, and two resistors $R_1$ and $R_2$ for generating a reference voltage $V_R$. In this case, the values of the resistors $R_1$ and $R_2$ are selected in such a manner that the reference voltage $V_R$ is an intermediate value between the high and low potentials of a TTL level.

In addition, the pre-amplifier P-AMP comprises two transistors $Q_5$ and $Q_6$ which have gates connected to the nodes $N_1$ and $N_2$, respectively, sources connected to the power supply $V_{SS}$ and drains connected to the main amplifier M-AMP. On the other hand, the main amplifier M-AMP comprises a flip-flop $FF_1$ formed by four transistors $Q_7$, $Q_8$, $Q_9$ and $Q_{10}$, three transistors $Q_{11}$, $Q_{12}$ and $Q_{13}$ for presetting the potentials of output signals A* and $\overline{A}$* at a high level, and two transistors $Q_{14}$ and $Q_{15}$ for increasing the speed of changes of the potentials of the signals A* and $\overline{A}$*. In the main amplifier M-AMP, nodes $N_3$ and $N_4$ of the flip-flop $FF_1$ are connected to the pre-amplifier P-AMP, while the signals A* and $\overline{A}$* are supplied to the output circuit OUT.

The output circuit comprises a flip-flop $FF_2$ formed by four transistors $Q_{16}$, $Q_{17}$, $Q_{18}$ and $Q_{19}$, two transistors $Q_{20}$ and $Q_{22}$ for generating output signals A and $\overline{A}$ of a MOS level, and two transistors $Q_{21}$ and $Q_{23}$ for presetting the potentials of the signals A and $\overline{A}$ at a low level ($V_{SS}$).

Figure 3:
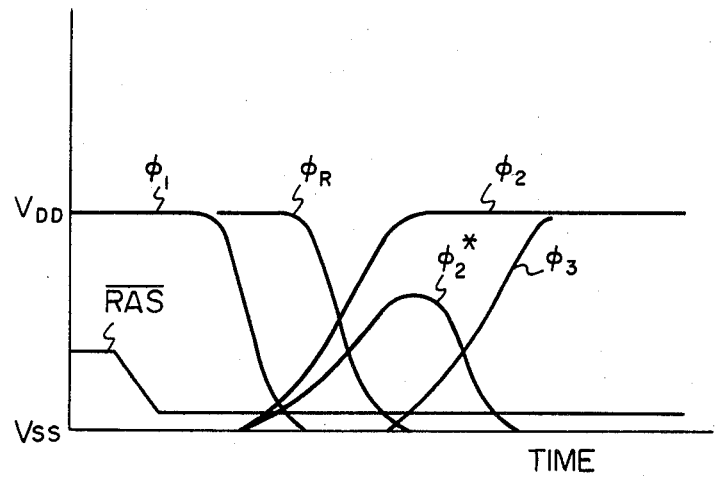
FIG. 3 is a timing diagram showing the internal clock signals supplied to the circuit of FIG. 2.

FIG. 3 is a timing diagram showing the internal clock signals $\phi_1$, $\phi_2$, $\phi_2^*$, $\phi_R$ and $\phi_3$ supplied to the circuit of FIG. 2. As illustrated in FIG. 3, firstly, the potential of the signal $\overline{RAS}$ falls so as to trigger the clock generator 9 (FIG. 1). After a predetermined time, the potentials of the clock signals $\phi_2$ and $\phi_2^*$ begin to rise towards the level $V_{DD}$, while the potential of the clock signal $\phi_R$ begins to fall. Next, after a while, the potential of the clock signal $\phi_3$ begins to rise toward the high level $V_{DD}$ and, in turn, the potential of the clock signal $\phi_2^*$ which does not yet reach the high level ($V_{DD}$) begins to fall toward the low level ($V_{SS}$).

Figure 4:
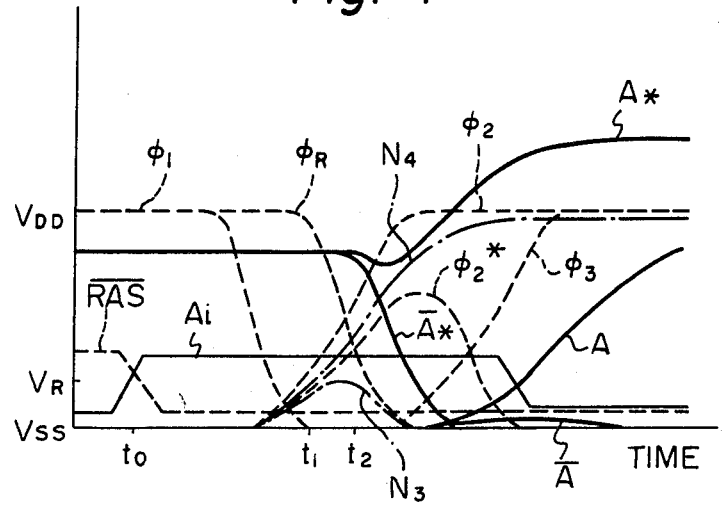
FIG. 4 is a timing diagram showing the signals appearing in the circuit of FIG. 2.

FIG. 4 is a timing diagram showing the signals appearing in the circuit of FIG. 2. Referring to FIG. 4, the circuit of FIG. 2 will now be explained. At a time $t_0$, the potential of the address signal $A_i$ is changed from low to high. At this time, since the potential of the clock signal $\phi_1$ is high, the nodes $N_1$ and $N_2$ are charged by the signal $A_i$ and the reference voltage $V_{R1}$, respectively, so that, in the pre-amplifier P-AMP, the conductance of the transistor $Q_5$ is larger than that of the transistor $Q_6$. As a result, in the main amplifier M-AMP, the potentials at the nodes $N_3$ and $N_4$ are going to be in the low and high levels, respectively. However, actually, at this time, the potentials at the nodes $N_3$ and $N_4$ are the same as each other, since the potential of the clock signal $\phi_R$ is high. In more detail, in this case, the transistors $Q_{11}$, $Q_{12}$ and $Q_{13}$ are turned on so that the potentials of the signals A* and $\overline{A}$* are high and accordingly, the transistors $Q_7$ and $Q_8$ are turned on. As a result, the nodes $N_3$ and $N_4$ are short-circuited. Thus, the potentials at the nodes $N_3$ and $N_4$ are both about $V_{SS}$.

It should be noted that the clock signal $\phi_R$ serves as a reset clock signal for preventing the former operation from affecting the next operation.

Next, the potential of the clock signal $\phi_1$ becomes low. As a result, the potentials at the nodes $N_1$ and $N_2$ remain at the same level.

Next, the potential of the clock signals $\phi_2$ and $\phi_2^*$ become high and, simultaneously, the potential of the clock signal $\phi_R$ becomes low. Therefore, due to the rising of the potential $\phi_2^*$, the capacitor $C_1$ and $C_2$ increase the potentials at the nodes $N_1$ and $N_2$, respectively, so that, at a time $t_1$, such potentials become higher than the threshold voltage (which is abbreviated to $V_{th}$) of the transistors $Q_5$ and $Q_6$. Thus, the pre-amplifier P-AMP begins to operate at the time $t_1$. Simultaneously, the potentials at the nodes $N_3$ and $N_4$ become slightly higher than the level $V_{SS}$. In addition, due to the rising of the potential of the clock signal $\phi_2$, the potential at the node $N_4$ becomes high, while the potential at the node $N_3$ remains at the same level. At a time $t_2$, the flip-flop $FF_1$ begins to operate, so that the potentials at the nodes $N_3$ and $N_4$ change to the levels $V_{SS}$ and $V_{DD}$, respectively, at the end of the rising of the potential of the clock signal $\phi_2$. As a result at the time $t_1$, the potential of the clock signal $\phi_2$ equals, for example, 0.2 volts, while, at the time $t_2$, the potential of the clock signal $\phi_2$ equals, for example, 0.8 volts which is the threshold voltage of the transistors $Q_9$ and $Q_{10}$. As a result, the transistos $Q_{14}$ and $Q_{15}$ are turned on and off, respectively, so that the potentials of the signals A* and $\overline{A}$* become high and low, respectively.

In the output circuit OUT, when the potentials of the signals A* and $\overline{A}$* are high and low, respectively, the transistors $Q_{17}$ and $Q_{18}$ are turned on, while the transistors $Q_{16}$ and $Q_{19}$ are turned off. Next, when the potential of the clock signal $\phi_3$ begins to rise, the potential at nodes $N_6$ and $N_5$ become high and low, respectively, so that the transistors $Q_{22}$ and $Q_{20}$ are turned on and off, respectively, and accordingly, the potentials of the signals A and $\overline{A}$ become high and low, respectively.

It should be noted that, the rising of the potential of the clock signal $\phi_2$ follows the supplying of the address signal $A_i$, as explained above. Therefore, when the potential of the clock signal $\phi_2$ rises, appropriate voltages are applied to the gates of the transistors $Q_5$ and $Q_6$. As a result, the potential at the node $N_4$ rises in the same way as the clock $\phi_2$, while the potential at the node $N_3$ rises; however, it immediately returns to the low level.

In addition, since the signals A∗ and $\overline{A}$∗ are supplied to the flip-flop FF$_2$, prior to the rising of the clock signal $\phi_3$, a bootstrap effect causes the potential of the signal A∗ to be higher than that of the clock signal $\phi_2$.

Further, in the input circuit IMP of FIG. 2, the potential of the signal $A_i$ is maintained at the node $N_1$ by the transition of the potential of the clock $\phi_1$ from high to low. After that, even when the potential of the signal $A_i$ is changed, the potential at the node $N_1$ is maintained at the time $t_1$ when the pre-amplifier P-AMP begins to operate. The presence of the MOS capacitor $Q_3$ prevents an undershoot from being transmitted to the node $N_1$. In this case, if the MOS capacitor $Q_3$ is not present in the input circuit INP, the transistors $Q_1$ and $Q_2$ are turned on even if the potential of the clock $\phi_1$ is low, so that a current flows from the node $N_1$ and through the transistors $Q_2$ and $Q_1$. As a result, the potential at the node $N_1$ falls, which means that the address information is reversed. In this regard, the presence of the MOS capacitor $Q_3$ causes itself to be charged, so that the potentials of the source and drain of the transistor $Q_2$ are both high. Therefore, when an undershoot of the address signal $A_i$ is generated, the charges stored in the capacitor $Q_3$ are discharged through the transistor $Q_1$; however, the transistor $Q_2$ does not conduct. This is because, before the charges stored in the MOS capacitor $Q_3$ are discharged completely, the undershoot of the address signal $A_i$ disappears.

However, in the above-mentioned circuit of FIG. 2 are the following disadvantages.

(1) The circuit is of a relatively large scale, since a large number of elements are required.

(2) The operation speed of the circuit is relatively low, since, when the address signal $A_i$ is supplied to the input circuit INP, the MOS capacitor $Q_3$ and the capacitor $C_1$ which form a CR time-constant circuit are charged by the address signal $A_i$ so that the rising of the potential at the node $N_1$ is considerably slow as compared with that of the potential of the address signal $A_i$. This necessitates delaying in the initial operations of the pre-amplifier P-AMP and the main amplifier M-AMP. Otherwise, the amplifiers may be operated by an error address signal. In order to avoid this, the inputting of the address signal $A_i$ can be prior to the falling of the signal $\overline{RAS}$; however, in this case, a clock signal therefor is required. In this case, the time-period between the inputting of the address signal $A_i$ and the falling of the signal RAS is called an address setting-up time.

(3) The operation of the circuit is unstable, since the reference voltage $V_R$ is dependent upon the power supply $V_{DD}$ so that the reference voltage $V_R$ is fluctuated due to the fluctuation of the power supply $V_{DD}$. Therefore, the threshold voltage of the address signal $A_i$ is dependent upon the power supply $V_{DD}$ and accordingly, it is difficult to increase the margin of the power supply $V_{DD}$. In addition, since the difference between the time $t_1$ when the pre-amplifier P-AMP is operated and the time $t_2$ when the main amplifier M-AMP is operated is relatively small as illustrated in FIG. 4, the main amplifier M-AMP may be operated before the pre-amplifier P-AMP comes into a predetermined state, which invites the malfunction of the main amplifier M-AMP.

Figure 5:
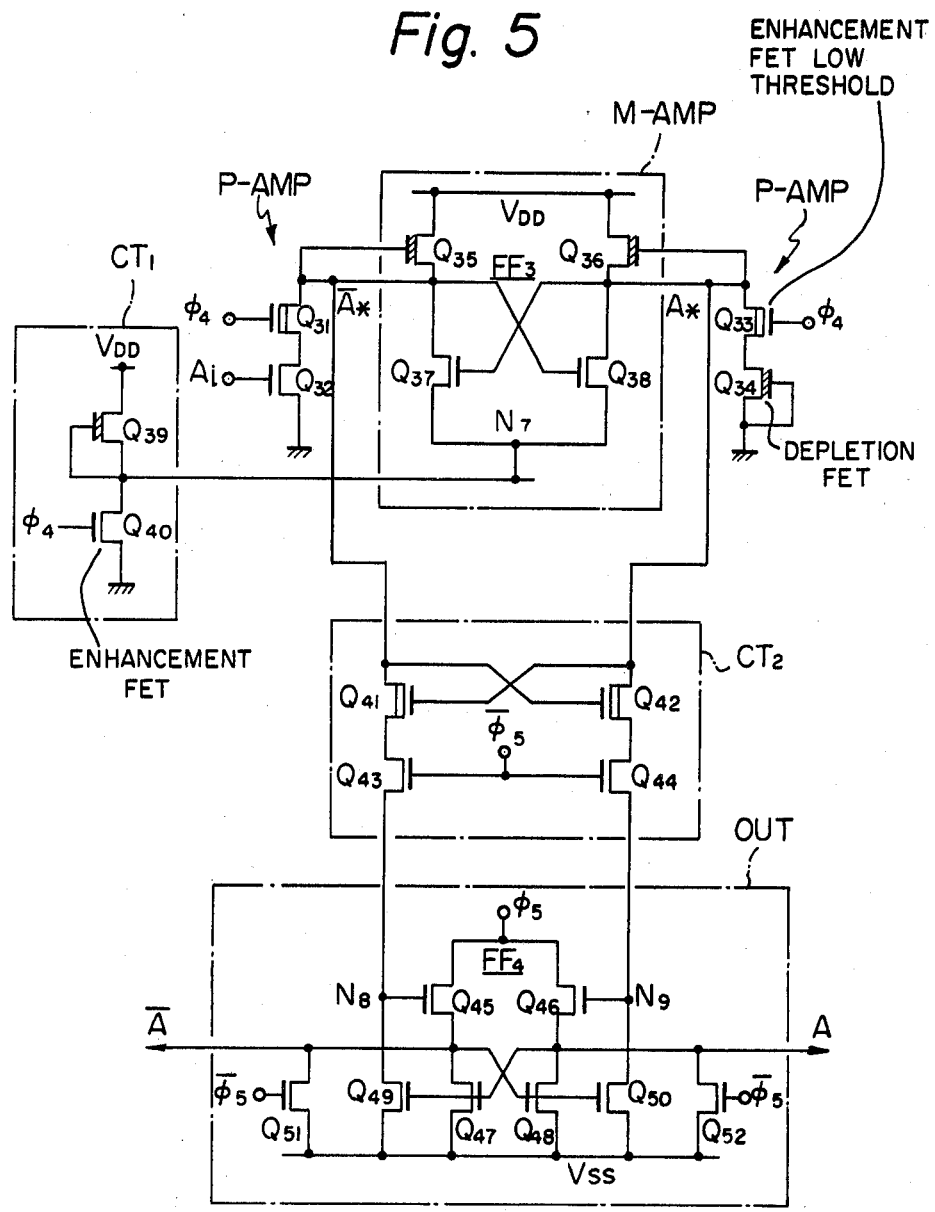
FIG. 5 is a circuit diagram illustrating an embodiment of the address buffer circuit according to the present invention.

FIG. 5 is a circuit diagram illustrating an embodiment of the address buffer circuit according to the present invention. In FIG. 5, the address buffer circuit comprises a pre-amplifier P-AMP for receiving an address signal $A_i$ of a TTL level, a main amplifier M-AMP comprised of a flip-flop FF$_3$, a circuit CT$_1$ for defining the potential at a node $N_7$, and an output circuit OUT for producing address signals A and $\overline{A}$ of a MOS level. In addition, the address buffer circuit comprises a circuit CT$_2$ for charging nodes $N_8$ and $N_9$ of the output circuit OUT in the case of the stand-by state thereof and for electrically disconnecting the output circuit OUT from a main amplifier M-AMP in the specified operation state of the output circuit OUT.

In FIG. 5, note that transistors with shaded gates are of a depletion type and other transistors are of an enhancement type. In addition, transistors with an additional line are of an enhancement type which has a relatively low threshold voltage value such as about 0.4 volts. In this case, the threshold voltage of a usual enhancement transistor is about 0.8 volts.

As illustrated in FIG. 5, the address signal $A_i$ of a TTL level is supplied directly to the pre-amplifier P-AMP, since the address buffer circuit of FIG. 5 is not provided with the input circuit INP of FIG. 2 formed by a CR time-constant circuit, so that the operation speed can be increased.

In more detail, the pre-amplifier P-AMP comprises four transistors $Q_{31}$, $Q_{32}$, $Q_{33}$ and $Q_{34}$. In this case, the conductivity of the transistor $Q_{34}$ is selected to be an intermediate value between the conductivity of the transistor $Q_{32}$ in the case where the potential of the signal $A_i$ is high, and that of the transistor $Q_{32}$ in the case where the potential of the signal $A_i$ is low. That is, the depletion type transistor $Q_{34}$ serves as a series circuit formed by the resistors $R_1$ and $R_2$ for generating the reference voltage $V_R$ in FIG. 2. In other words, a constant current flowing through the transistor $Q_{34}$ is made use of, instead of the reference voltage $V_R$ in FIG. 2. Here, a drain current is represented by $\beta/2(V_{gs}-V_{th})^2$ where $\beta$ is a current gain; $V_{gs}$ is a gate-source voltage; and $V_{th}$ is a threshold voltage. In the case of the transistor $Q_{34}$ where the gate and the source is short-circuited, $V_{gs}=0$. Therefore, the current flowing through the transistor $Q_{34}$ is $\beta/2\ V_{th}^2$, which is a constant value independent of a power supply voltage $V_{DD}$ and the potentials of other signals, which is helpful in stabilizing the operation.

The above-mentioned pre-amplifier P-AMP is controlled by a clock signal $\phi_4$.

The main amplifier M-AMP comprises two transistors $Q_{35}$ and $Q_{36}$ of a depletion type and two transistors $Q_{37}$ and $Q_{38}$ of an enhancement type, which form the flip-flop FF$_3$. In this case, the transistor $Q_{37}$ and $Q_{38}$ are cross-coupled. The operation of the main amplifier M-AMP is controlled by the circuit CT$_1$ which, in this case, controls the potential at a node $N_7$.

The circuit CT$_1$ is comprises of a transistor $Q_{39}$ of a depletion type and a transistor $Q_{40}$ of an enhancement type which is also controlled by the clock signal $\phi_4$.

The circuit CT$_2$ is comprised of four transistors $Q_{41}$, $Q_{42}$, $Q_{43}$ and $Q_{44}$ of enhancement type. In this case, the threshold voltages of the transistors $Q_{41}$ and $Q_{42}$ are low. In the circuit CT$_2$, when the potentials of signals A∗ and $\overline{A}$∗ outputted from the main amplifier M-AMP are both high, two nodes $N_8$ and $N_9$ of the output circuit OUT are charged and the potentials at the nodes $N_8$ and $N_9$ are the same. Contrary to the above, when the potentials of the signals A∗ and $\overline{A}$∗ are high and low, respectively, the potentials at the nodes $N_8$ and $N_9$ become low and high, respectively. However, in this case, if the potential of a clock signal $\bar{\phi}_5$ is low, the transistors Q$_{43}$ and Q$_{44}$ are turned off, so that the difference in potential between the signals A∗ and $\bar{\text{A}}$∗ are not transmitted to the nodes N$_8$ and N$_9$. This means that the output circuit OT is electrically disconnected from the main amplifier M-AMP.

The output circuit OUT comprises four transistors Q$_{45}$, Q$_{46}$, Q$_{47}$ and Q$_{48}$ which form the flip-flop FF$_4$, two transistors Q$_{49}$ and Q$_{50}$, and two transistors Q$_{51}$ and Q$_{52}$ which are controlled by the clock signal $\bar{\phi}_5$. Therefore, in the stand-by state where the potential of the clock signal $\bar{\phi}_5$ is high, the potentials of the output signal A and $\bar{\text{A}}$ both remain low.

As explained above, in order to operate the address buffer circuit of FIG. 5, three clock signals $\phi_4$, $\phi_5$ and $\bar{\phi}_5$ are necessary.

Figure 6:
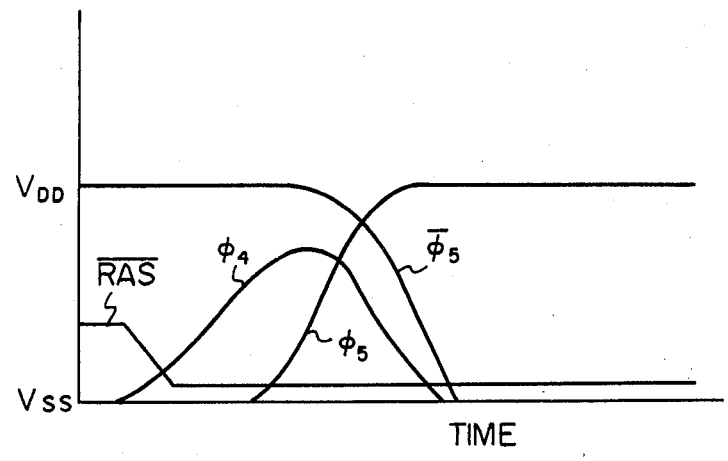
FIG. 6 is a timing diagram showing the internal clock signals supplied to the circuit of FIG. 5.

FIG. 6 is a timing diagram showing the internal clock signals supplied to the circuit of FIG. 5. As illustrated in FIG. 6, the potential of the clock signal $\phi_4$ begins to rise in association with the falling of the signal $\overline{\text{RAS}}$ and, a little later, the potential of the clock signal $\phi_4$ again returns to the low level, which is necessary for a dynamic operation of the circuit of FIG. 5. In addition, the potential of the clock signal $\phi_5$ begins to rise, while the potential of the clock signal $\bar{\phi}_5$ begins to fall. As understood from FIGS. 5 and 6, according to the present invention, the number of clock signals for driving the address buffer circuit is small so that control thereof can be simplified.

Figure 7:
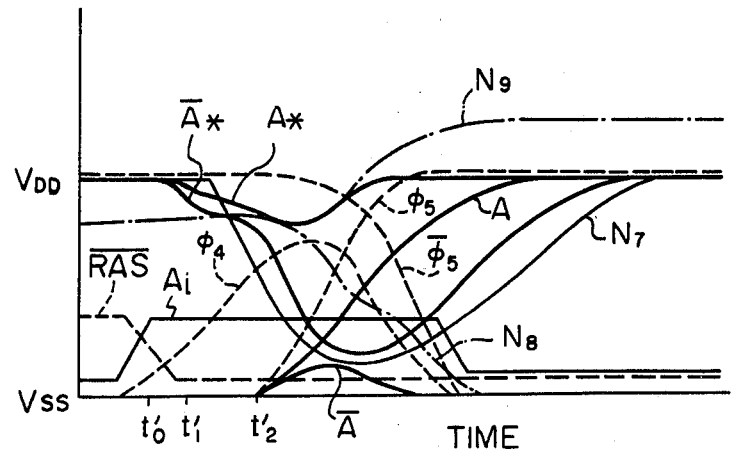
FIG. 7 is a timing diagram showing the signals appearing in the circuit of FIG. 5.

FIG. 7 is a timing diagram showing the signals appearing in the circuit of FIG. 5. Referring to FIG. 7, the operation of the circuit of FIG. 5 will now be explained. At a time t$_0'$, the potential of the address signal A$_i$ is changed from low to high. At this time, since the potential of the clock signal $\phi_4$ begins to rise, the potentials of the signals A∗ and $\bar{\text{A}}$∗ both begin to fall because of the changes of conductances in the transistors Q$_{31}$ through Q$_{34}$. In this case, since a current flowing through the transistor Q$_{32}$ is larger than the current flowing through the transistor Q$_{34}$, the potential of the signal $\bar{\text{A}}$∗ becomes lower than that of the signal A∗. Note that, before the time t$_0'$, the potentials of the signals A∗ and $\bar{\text{A}}$∗ remain at a high level due to the conductances of the transistors Q$_{35}$ and Q$_{36}$.

On the other hand, in the circuit CT$_1$, the rising of the potential of the clock signal $\phi_4$ turns on the transistor Q$_{40}$, so that the potential at the node N$_7$ falls. As a result, the main amplifier M-AMP begins to operate. Since the potential of the signal $\bar{\text{A}}$∗ is a little lower than that of the signal A∗, the transistors Q$_{37}$ and Q$_{38}$ are turned on and off, respectively. Therefore, the potential of the signal $\bar{\text{A}}$∗ rapidly falls due to the conduction of the transistor Q$_{37}$ which is of a relatively large scale. Althrough the potential of the signal A∗ also falls due to the conduction of the transistors Q$_{33}$ and Q$_{34}$, the potential of the signal A∗ again rises due to the cut-off of the transistor Q$_{38}$. Next, the potential of the clock signal $\phi_4$ again falls, so that the transistor Q$_{31}$, Q$_{33}$ and Q$_{40}$ are gradually cut off. As a result, the pre-amplifier P-AMP separates from the main amplifier M-AMP and simultaneously, the potential at the node N$_7$ rises through the depletion type transistor Q$_{39}$. Accordingly, the rising of the potential at the node N$_7$ raises the potentials of the signals A∗ and $\bar{\text{A}}$∗.

In the circuit $\overline{\text{C}}$T$_2$, as explained above, when the potentials of the signal A∗ and $\bar{\text{A}}$∗ are both high, the nodes N$_8$ and N$_9$ of the output circuit OUT are charged by the transistors Q$_{41}$, Q$_{42}$, Q$_{43}$ and Q$_{44}$. In this state, when the potentials of the signals A∗ and $\bar{\text{A}}$∗ become high and low, respectively, the transistors Q$_{41}$ and Q$_{42}$ are turned on and off, respectively, so that the potentials at the nodes N$_8$ and N$_9$ become low and high, respectively. Next, when the potential of the clock signal $\phi_5$ rises, the output circuit OUT begins to operate. In this case, the conductance of the transistor Q$_{46}$ is larger than that of the transistor Q$_{45}$, so that the transistors Q$_{47}$ and Q$_{48}$ are turned on and off, respectively. Therefore, the potentials of the signals A and $\bar{\text{A}}$ become high and low, respectively. In addition, in this case, the transistors Q$_{49}$ and Q$_{50}$ are turned on and off, respectively, which promotes the lowering of the potential at the node N$_8$ and retains the high potential at the node N$_9$.

In FIG. 7, the reason why the potential at the node N$_9$ is much higher than the level V$_{DD}$ is that a bootstrap effect is generated due to the rising of the potential of the signal A. In addition, prior to the changes of the potentials of the signals A and $\bar{\text{A}}$, such potentials remain low, since the transistors Q$_{51}$ and Q$_{52}$ are conductive due to the high potential of the clock signal $\bar{\phi}_5$.

In FIG. 5, if an undershoot of the potential of the address signal A$_i$ is generated, only the transistor Q$_{32}$ is turned off, which causes no problem.

As explained hereinbefore, the address buffer circuit according to the present invention has the following advantages as compared with the conventional circuit of FIG. 2.

(1) The circuit is of a small size, since there are a smaller number of elements in FIG. 5 than in FIG. 2.

(2) The operation speed becomes large, since the input circuit INP formed by a CR time-constant circuit used in FIG. 2 is unnecessary.

(3) The operation of the circuit is stable. This is because, in the present invention, immediately after the potential of the clock signal $\phi_4$ rises, the pre-amplifier P-AMP begins to operate due to the presence of the transistors Q$_{31}$ and Q$_{33}$ having low threshold voltage values. In addition, since the conduction of the transistor Q$_{40}$ is later than that of the transistors Q$_{31}$ and Q$_{33}$, the falling of the potential at the node N$_7$ can be delayed. Therefore, the difference between the time t$_1'$ when the pre-amplifier P-AMP begins to operate and the time t$_2'$ when the main amplifier M-AMP begins to operate can be easily enlarged, which is helpful in the stable operation of the circuit. Further, the falling time of the potential at the node N$_7$ can be selected by changing the dimensions of the transistor Q$_{40}$. Thus, the main amplifier M-AMP begins to operate, after the pre-amplifier P-AMP comes into a predetermined state.

In addition, in the circuit CT$_2$, as explained above, the transistors Q$_{43}$ and Q$_{44}$ are controlled on and off by the clock signal $\bar{\phi}_5$. Therefore, after the output circuit OUT begins to operate, the output circuit OUT separates from the main amplifier M-AMP, which is also helpful in the stable operation of the circuit.

I claim:

1. An address buffer circuit, operatively connectable to receive an address signal of a TTL level and a first clock signal, for converting said address signal of the TTL level into an address signal of a MOS level and its inverted signal, comprising:

first and second power supplies;

a pre-amplifier, operatively connected to said second power supply and having outputs, for receiving the address signal of a TTL level;

a main amplifier, operatively connected to the outputs of said pre-amplifier, having first and second inputs and having outputs and comprising a first flip-flop having a first terminal operatively connected to said first power supply and having a second terminal;

a defining circuit, operatively connected between said first and second power supplies and to said second terminal of said first flip-flop, for defining the potential of said second terminal of said first flip-flop; and an output circuit, operatively connected to outputs of said main amplifier and comprising a second flip-flop, for producing the address signal of the MOS level and its inverted signal;

wherein said pre-amplifier comprises:

a first transistor of an enhancement type having a drain operatively connected to the first input of said main amplifier, having a source and having a gate operatively connectable to receive the first clock signal;

a second transistor of an enhancement type having a drain operatively connected to the source of said first transistor, a source operatively connected to said second power supply and a gate operatively connectable to receive said address signal of a TTL level;

a third transistor of an enhancement type having a drain operatively connected to the second input of said main amplifier, having a source and having a gate operatively connectable to receive said first clock signal; and a fourth transistor of a depletion type having a drain operatively connected to the source of said third transistor, and having a gate operatively connected to a source of said fourth transistor and to said second power supply.

2. An address buffer circuit as set forth in claim 1, wherein said output circuit has standby and active states, and said address buffer circuit further comprising a charging and disconnecting circuit, operatively connected between said main amplifier and said output circuit, for charging said second flip-flop of said output circuit when said output circuit is in the stand-by state and for electrically disconnecting said output circuit from said main amplifier when said output circuit is in the active state.

3. An address buffer circuit as set forth in claim 1, wherein said first and second transistors are of an enhancement type having first threshold voltage values.

4. An address buffer circuit as set forth in claim 1, wherein said first flip-flop comprises:

fifth and sixth transistors of a depletion type, each having a source, a drain operatively connected to said first power supply and a gate operatively connected to one of the drains of said first and third transistors respectively; and seventh and eighth transistors of an enhancement type, each having a drain operatively connected to one of the sources of said fifth and sixth transistors, respectively, a source operatively connected to said second terminal and a gate operatively connected to one of the drains of said eighth and seventh transistors, respectively.

5. An address buffer circuit as set forth in claim 1, wherein said defining circuit comprises:

a ninth transistor of a depletion type having a drain operatively connected to said first power supply and a gate operatively connected to a source of said ninth transistor and to said second terminal of said first flip-flop; and a tenth transistor of an enhancement type having a drain operatively connected to the source of said ninth transistor, a source operatively connected to said second power supply and a gate operatively connectable to receive said first clock signal.

6. An address buffer circuit as set forth in claim 2, wherein said address buffer circuit is operatively connectable to receive a second clock signal, wherein said output circuit has inputs, and wherein said charging and disconnecting circuit comprises:

eleventh and twelfth transistors of an enhancement type having first threshold voltage values, each having a source, a drain operatively connected to the respective one of the outputs of said main amplifier and a gate operatively connected to one of the drains of said twelfth and eleventh transistors, respectively; and thirteenth and fourteenth transistors of an enhancement type, each having a drain operatively connected to the respective one of the sources of said eleventh and twelfth transistors, a gate operatively connectable to receive the second clock signal and a source operatively connected to the respective one of the inputs of said output circuit.

7. An address buffer circuit as set forth in claim 1, wherein said address buffer circuit is operatively connectable to receive a second clock signal and a third clock signal which is said second clock signal inverted, and wherein said output circuit comprises:

fifteenth and sixteenth transistors of an enhancement type, each having a source, a drain operatively connectable to receive the third clock signal and a gate operatively connected to the respective one of the outputs of said main amplifier;

seventeenth and eighteenth transistors of an enhancement type, each having a drain operatively connected to the respective one of the sources of said fifteenth and sixteenth transistors, a source operatively connected to a third power supply and a gate operatively connected to one of the drains of said eighteenth and seventeenth transistors, respectively;

nineteenth and twentieth transistors of an enhancement type, each having a drain operatively connected to one of the gates of said fifteenth and sixteenth transistors, respectively, a source operatively connected to said third power supply and a gate operatively connected to one of the drains of said eighteenth and seventeenth transistors, respectively; and twenty-first and twenty-second transistors of an enhancement type, each having a drain operatively connected to the respective one of the drains of said seventeenth and eighteenth transistors, a source operatively connected to said third power supply and a gate operatively connectable to receive said second clock signal.

8. An address buffer circuit as set forth in claim 2, wherein said address buffer circuit is operatively connectable to receive a second clock signal and a third clock signal which is said second clock signal inverted, wherein said charging and disconnecting circuit has outputs, and wherein said output circuit comprises:

fifteenth and sixteenth transistors of an enhancement type, each having a source, a drain operatively connectable to receive the third clock signal, and a gate operatively connected to the respective one of outputs of said charging and disconnecting circuit;

seventeenth and eighteenth transistors of an enhancement type, each having a drain operatively connected to the respective one of the sources of said fifteenth and sixteenth transistors, a source operatively connected to a third power supply and a gate operatively connected to one of the drains of said eighteenth and seventeenth transistors, respectively;

nineteenth and twentieth transistors of an enhancement type, each having a drain operatively connected to one of the gates of said fifteenth and sixteenth transistors, respectively, a source operatively connected to said third power supply and a gate operatively connected to one of the drains of said eighteenth and seventeenth transistors, respectively; and twenty-first and twenty-second transistors of an enhancement type, each having a drain operatively connected to the respective one of the drains of said seventeenth and eighteenth transistors, a source operatively connected to said third power supply and a gate operatively connectable to receive said second clock signal.

* * * * *

UNITED STATES PATENT AND TRADEMARK OFFICE
CERTIFICATE OF CORRECTION

PATENT NO. : 4,396,845

DATED : August 2, 1983

INVENTOR(S) : Tomio Nakano

It is certified that error appears in the above-identified patent and that said Letters Patent is hereby corrected as shown below:

Front page, "OTHER PUBLICATIONS", "vol. 18" should be --Vol. 18--; after "3722", insert --(307-475)--.

In the "ABSTRACT", line 3, "an" should be --and--.

Column 2, line 1, after "having", delete ",";
line 2, after "and", insert --having--;
line 3, after "level;", delete "having--.

Column 3, line 47, "$A_*$" second occurrence should be --$\bar{A}_*$--.

Column 4, line 46, after "result", insert --,--.

Column 6, line 55, "comprises" should be --comprised--.

Column 7, line 26, "5" should be --3--;
line 54, "Althrough" should be --Although--;
line 65, "$\overline{CT}_2$" should be --$CT_2$--;
line 66, "$\overline{A}_*^2$" first occurrence, should be --$A_*$--.

Signed and Sealed this

First Day of May 1984

[SEAL]

Attest:

GERALD J. MOSSINGHOFF

Attesting Officer       Commissioner of Patents and Trademarks